(12) United States Patent
Ohsaki

(10) Patent No.: US 6,646,714 B2
(45) Date of Patent: Nov. 11, 2003

(54) EXPOSURE APPARATUS, IMAGING PERFORMANCE MEASUREMENT METHOD, DEVICE MANUFACTURING METHOD, SEMICONDUCTOR MANUFACTURING FACTORY, AND EXPOSURE APPARATUS MAINTENANCE METHOD

(75) Inventor: Yoshinori Ohsaki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/954,035

(22) Filed: Sep. 18, 2001

(65) Prior Publication Data

US 2002/0033935 A1 Mar. 21, 2002

(30) Foreign Application Priority Data

Sep. 20, 2000 (JP) ........................ 2000-284616

(51) Int. Cl.$^7$ .............................................. G03B 27/68
(52) U.S. Cl. ...................................................... 355/52
(58) Field of Search ............................... 355/52, 53, 30, 355/55, 77

(56) References Cited

U.S. PATENT DOCUMENTS

| | | | | |
|---|---|---|---|---|
| 4,780,616 A | * | 10/1988 | Nishi et al. | 250/548 |
| 4,886,974 A | | 12/1989 | Ina | 250/561 |
| 4,901,109 A | | 2/1990 | Mitome et al. | 355/68 |
| 4,952,815 A | * | 8/1990 | Nishi | 250/548 |
| 5,424,552 A | * | 6/1995 | Tsuji et al. | 250/548 |
| 5,659,384 A | | 8/1997 | Ina | 355/53 |
| 5,760,879 A | | 6/1998 | Shinonaga et al. | 355/55 |
| 5,789,734 A | * | 8/1998 | Torigoe et al. | 250/201.2 |
| 5,943,135 A | | 8/1999 | Mishima | 356/401 |
| 6,130,747 A | | 10/2000 | Nomura et al. | 356/239.2 |
| 6,385,497 B1 | * | 5/2002 | Ogushi et al. | 700/110 |
| 2001/0055100 A1 | * | 12/2001 | Murakami | 355/53 |

FOREIGN PATENT DOCUMENTS

| | | |
|---|---|---|
| JP | 9-167738 | 6/1997 |
| JP | 9-280816 | 10/1997 |
| JP | 11-237310 | 8/1999 |

* cited by examiner

Primary Examiner—Russell Adams
Assistant Examiner—D. Ben Esplin
(74) Attorney, Agent, or Firm—Fitzpatrick, Cella, Harper & Scinto

(57) ABSTRACT

An exposure apparatus for projecting and exposing through a projection optical system a transfer pattern formed on a master onto a substrate placed on a movable stage. The apparatus includes a mark placed on the movable stage and imparting a phase difference to incident light, based on an incident position, and then outputting the light, an image reception section, wherein the mark is imaged on the image reception section, using light of an exposure wavelength through the projection optical system, and a data processing section for calculating an imaging performance of the projection optical system on the basis of image data obtained by the image reception section.

26 Claims, 11 Drawing Sheets

FIG. 9

```
URL  http://www.maintain.co.jp/db/input.html

TROUBLE DB INPUT WINDOW

OCCURRENCE DATE  [2000/3/15] ~404
TYPE OF APPARATUS  [* * * * * * * * *] ~401
SUBJECT  [OPERATION ERROR (START-UP ERROR)] ~403
SERIAL NUMBER S/N  [465NS4580001] ~402
DEGREE OF URGENCY  [D] ~405
SYMPTOM   [LED IS KEPT FLICKERING
           AFTER POWER-ON]             ~406

REMEDY    [POWER ON AGAIN
           (PRESS RED BUTTON IN ACTIVATION)]  ~407

PROGRESS  [INTERIM HAS BEEN DONE]       ~408

[SEND] [RESET]        410              411              412
              LINK TO RESULT LIST DATABASE   SOFTWARE LIBRARY   OPERATION GUIDE
```

SEMICONDUCTOR DEVICE MANUFACTURING FLOW

EXPOSURE APPARATUS, IMAGING PERFORMANCE MEASUREMENT METHOD, DEVICE MANUFACTURING METHOD, SEMICONDUCTOR MANUFACTURING FACTORY, AND EXPOSURE APPARATUS MAINTENANCE METHOD

FIELD OF THE INVENTION

The present invention relates to an exposure apparatus for transferring a pattern of a master such as a mask onto a photosensitive substrate such as a semiconductor wafer through a projection optical system, an imaging performance measurement method, a device manufacturing method, a semiconductor manufacturing factory, and an exposure apparatus maintenance method and, more particularly, to an imaging performance measurement method for a projection optical system and particularly, a coma measurement method.

BACKGROUND OF THE INVENTION

In manufacturing semiconductor devices in the photolithography process, a projection exposure apparatus has been used to transfer a circuit pattern or the like formed on a reticle, photomask, or the like (to be referred to as a reticle hereinafter) onto a semiconductor wafer or the like coated with a photoresist. An exposure apparatus of this type is required to accurately transfer the pattern on the reticle onto the wafer at a predetermined magnification (reduction ratio). To meet this requirement, it is important to use a projection optical system excellent in imaging performance and almost free from aberrations. Patterns, resolutions of which exceed the general imaging performance of an optical system, have often been transferred due to recent demand for finer micropatterning of semiconductor devices. As a result, patterns to be transferred are more sensitive to aberrations of an optical system. An increase in exposure area and a high NA (Numerical Aperture) are required for a projection optical system. This makes it more difficult to correct aberrations.

Under these circumstances, a strong demand has arisen for measuring imaging performance and particularly coma of a projection optical system while the projection optical system is mounted in an exposure apparatus, i.e., while the exposure apparatus is actually used for exposure.

As a conventional method of measuring imaging performance, e.g., aberration of a projection optical system, a method is available to measure wave aberration of a projection optical system using an interferometer in the manufacture/adjustment with a projection lens alone. Another method is also available to observe the aerial image of a reticle or mask pattern which is formed through the projection optical system and calculating the imaging performance of the projection optical system from the aerial image. Still another method is available to project and expose about five line-end-space marks on a resist applied to a wafer, measure with a scanning electron microscope (SEM) the line width and shape of a resist image left upon development, and measure the imaging performance and particularly coma from the line width difference between or asymmetry of shapes of two lines at two ends. Recently, still another method is also known (Japanese Patent Laid-Open No. 11-237310) in which a small line width pattern is projected and exposed on a resist, a large line width pattern is then multiple-exposed on the small pattern, and relative misalignment between the patterns is measured by an alignment test device using the resist image left upon development.

Either method is unsatisfactory in calculating imaging performance of the projection optical system on the semiconductor exposure apparatus. First, in the method using the interferometer, the arrangement of a wave aberration measurement device is bulky to require a very large space. In addition, the optical arrangement of the wave aberration measurement device is greatly different from that of the semiconductor exposure apparatus. It is currently expected to be difficult to mount the interferometer in the exposure apparatus.

In the method of observing an aerial image, an aerial image observation optical system must be mounted in a wafer stage. The wafer stage of an exposure apparatus is generally movable at a very high speed from the viewpoints of throughput and control accuracy. It is very disadvantageous to mount the observation optical system in the wafer stage due to the weight. In addition, the internal space of the wafer stage is limited, and the observation optical system mounted inside the wafer stage must also be downsized. On the other hand, the aberration of the observation optical system must be minimized due to the function of measuring the aberration as the imaging performance of the projection optical system. This makes it difficult to downsize the observation optical system, resulting in a contradiction.

The method of observing the exposed resist image with the SEM allows obtaining imaging performance (aberration) in a state wherein the projection optical system is mounted on the main body. However, development and SEM measurement are required to evaluate the resist image, resulting in time-consuming and cumbersome operation.

SUMMARY OF THE INVENTION

It is an object of the present invention to solve the conventional problems described above, calculate imaging performance such as coma of a projection optical system with a simple arrangement without any development or SEM measurement, and hence perform exposure in a state of excellent imaging performance.

In order to achieve the above object, an exposure apparatus according to the present invention is an exposure apparatus for projecting and exposing a transfer pattern formed on a master such as a reticle onto a substrate such as a semiconductor wafer placed on a movable stage (wafer stage), characterized by comprising a step mark formed from a step and placed on the movable stage and preferably a stage reference mark, an image reception section for imaging the step mark on an image sensing element at an exposure wavelength through a projection optical system, and a data processing section for calculating imaging performance of the projection optical system on the basis of image data obtained from the image reception section.

An imaging performance measurement method according to the present invention is a method of measuring imaging performance of a projection optical system, characterized by comprising the steps of placing a step mark formed from a step near an image plane of the projection optical system, making an image sensing element sense an image of the step mark through the projection optical system using light having a wavelength used for the projection optical system, and calculating the imaging performance of the projection optical system on the basis of sensed image data.

A device manufacturing method according to the present invention is characterized by comprising the steps of installing manufacturing apparatuses for performing various processes including an exposure apparatus in a semiconductor manufacturing factory and manufacturing a semiconductor device through a plurality of processes using the manufacturing apparatuses. In addition, the device manufacturing method may comprise the steps of connecting manufacturing apparatuses via a local area network and communicating data information about at least one of the manufacturing apparatuses between the local area network and an external network outside the semiconductor manufacturing factory. A database provided by an exposure apparatus vendor or user may be accessed via the external network to perform data communication, thereby obtaining maintenance information of the manufacturing apparatuses. Alternatively, data communication may be performed with another semiconductor manufacturing factory different from the semiconductor manufacturing factory via the external network to perform production management.

A semiconductor manufacturing factory according to the present invention is characterized by comprising manufacturing apparatuses for performing various processes including the above exposure apparatus, a local area network for connecting the manufacturing apparatuses, and a gateway for allowing access from the local area network to an external network outside the factory, wherein data information about at least one of the manufacturing apparatuses can be communicated.

An exposure apparatus maintenance method according to the present invention is characterized by comprising the steps of making an exposure apparatus vendor or user provide a maintenance database connected to an external network outside a semiconductor manufacturing factory, allowing access from the semiconductor manufacturing factory to the maintenance database via the external network, and transmitting maintenance information stored in the maintenance database to the semiconductor manufacturing factory via the external network.

According to the present invention, the image of the step mark is imaged using the light having the wavelength used for the projection optical system through the projection optical system. The imaging performance and particularly coma of the projection optical system can be evaluated on the basis of the image data of the step mark. As a result, the imaging performance and particularly coma of the projection optical system can be calculated on the semiconductor exposure apparatus with a very simple arrangement without any development or SEM measurement.

Exposure can always be performed in a good aberration state by adjusting the aberration of the projection optical system on the basis of the calculated aberration.

Aberration measurement can be done upon a change in an exposure condition, or aberration measurement can be performed during continuous exposure. Aberration can be adjusted as needed to always allow exposure in a good aberration state.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 9 is a detailed view of a user interface;

DETAILED DESCRIPTION OF THE PREFERRED EMBODIMENTS

The imaging performance (e.g., coma) of a projection optical system can be calculated on the basis of asymmetry (asymmetry is represented by a comparison result of image signals of edges at a recess formed by a pair of symmetrical steps, and a larger image signal difference indicates a smaller degree of symmetry and a larger degree of asymmetry) of a step mark in image data.

The calculation of coma will be described in detail below.

Figure 5A:
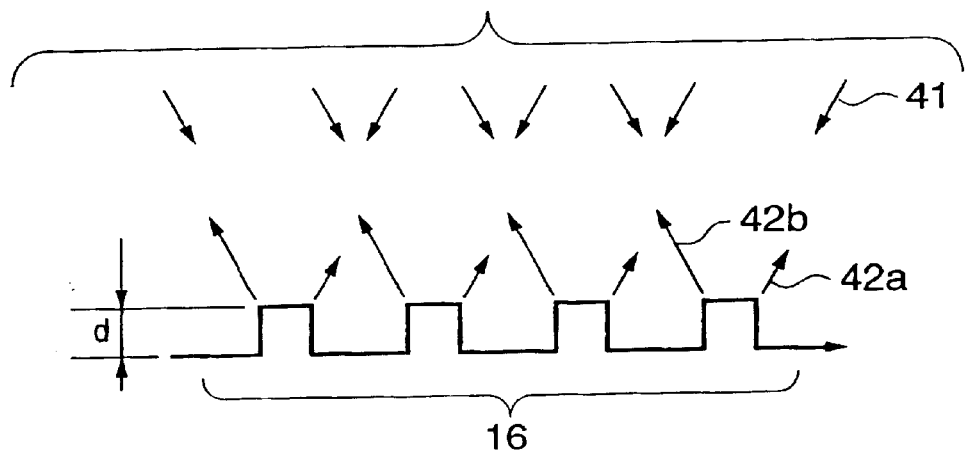
FIGS. 5A to 5C are views for explaining the step of an optical system and asymmetry of step mark images.
Figure 5B:
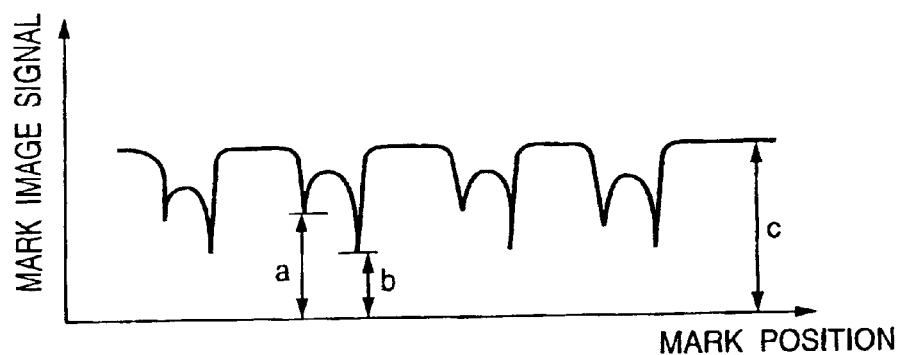
Figure 5C:
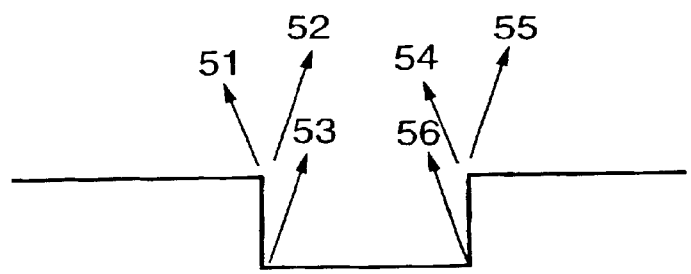

As described in Japanese Patent Laid-Open Nos. 9-167738 and 9-280816 filed by and issued to the present applicant, when an optical system has coma, a step mark waveform becomes asymmetrical, as shown in FIGS. 5A to 5C. FIG. 5A shows a state in which a mark 16 having a stepped shape along the section of the measurement direction is illuminated with illumination light 41. Scattered light beams 42a and 42b become asymmetrical in consideration of coma, as shown in FIG. 5A. FIG. 5B shows a reference mark image signal in the state of FIG. 5A. Detection light from a mark edge portion has a waveform asymmetrical about the mark center. When the coma increases, the degree of asymmetry of the detection waveform increases accordingly.

An evaluation value E is defined as:

$$E = (a-b)/c \tag{1}$$

where a is the intensity of one edge in the mark image signal in FIG. 5B, b is the intensity of the other edge in the mark image, and c is the intensity of the overall mark. In this case, the evaluation value E serves as a parameter representing waveform distortion. FIG. 5C is an enlarged view of one mark portion. Assume that scattered light beams from above the left mark edge are defined as 51 and 52, scattered light beams from above the right mark edge are defined as 54 and 55, a scattered light beam from below the left mark edge is defined as 53, and a scattered light beam from below the right mark edge is defined as 56. In this case, the light beams 52 and 55 emerging from the same edge may have asymmetrical relationships with the light beams 51 and 54 in imaging due to the influence of aberrations such as coma of the optical system.

The wavefronts (U) of the light beams 51 to 56 are represented using θ as a phase:

$$U_{51}=\cos\theta \quad U_{54}=\cos\theta$$

$$U_{52}=\cos(\theta+\theta_{CM}) \quad U_{55}=\cos(\theta+\theta_{CM})$$

$$U_{53}=\cos(\theta+\theta_{CM}+\theta_D) \quad U_{56}=\cos(\theta+\theta_D) \quad (2)$$

where $\theta_{CM}$ is the phase error by aberration and $\theta_D$ is the phase error by the mark step.

The intensity a in equation (1) representing the final waveform evaluation value E is the synthesis of light beams 51, 52, and 53, the intensity b is the synthesis of light beams 54, 55, and 56. A difference a−b of a waveform to be detected is defined by:

$$a-b=\int_0(U_{51}+U_{52}+U_{53})^2 d\theta - \int_0(U_{54}+U_{55}+U_{56})^2 d\theta \quad (3)$$

Figure 6A:
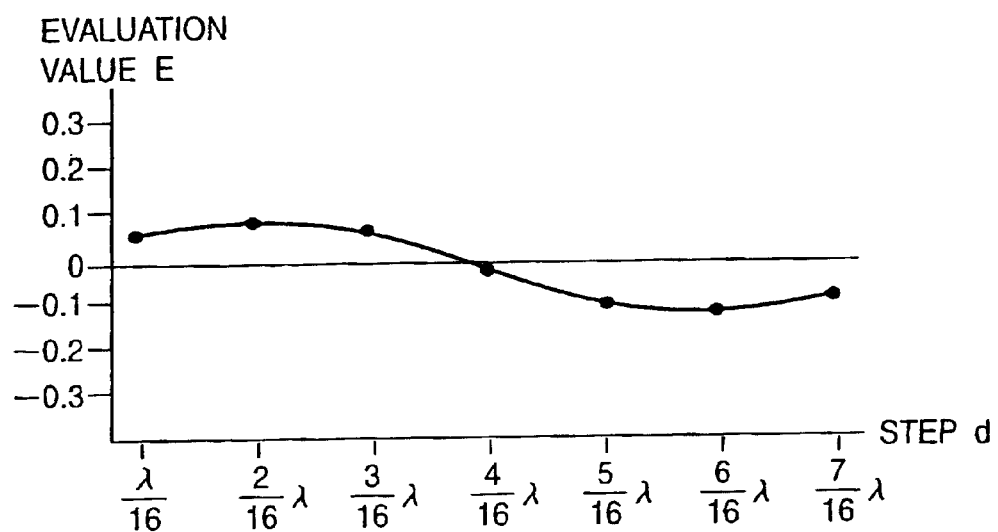
FIGS. 6A and 6B are graphs showing the correlation between the step amount and asymmetry of step mark images.
Figure 6B:
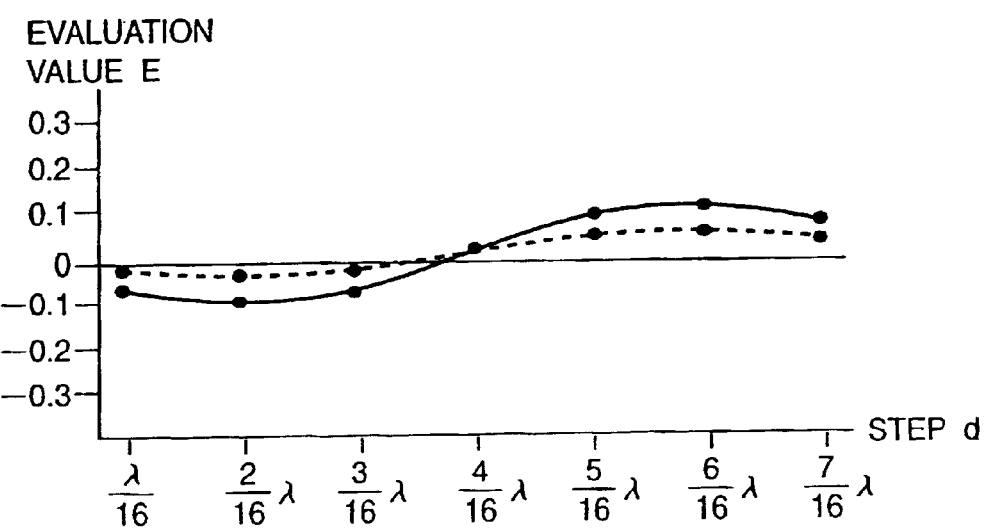

The result of numerically calculating the evaluation value E on the basis of equations (1) to (3) is shown in FIG. 6B. Two curves correspond to cases wherein coma values are λ/10 (solid line) and λ/20 (broken line). The result of an actual experiment using an optical system is shown in FIG. 6A. In this case, the two curves accurately match.

According to the experiment and theoretical simulation, it has been confirmed that the evaluation value E changes depending on the magnitude of coma, and a larger coma value causes an increase in absolute value of the evaluation value E. That is, the coma of the projection optical system can be quantitatively evaluated using this evaluation value. The higher the NA, the higher the sensitivity of the evaluation value E with respect to coma. Therefore, the evaluation value E is suitable for evaluating the coma of the optical system having a high NA exceeding 0.6.

In the above description, the evaluation value E is defined to evaluate asymmetry. The waveform changes depending on the NA, illumination conditions, line width, and focus of the projection optical system. The evaluation value for asymmetry is not limited to E. For example, an evaluation value for asymmetry, which is most sensitive to coma depending on conditions may be preferably used such that asymmetry of a side peak portion is used. Asymmetry typically appears when not a waveform in an in-focus state but a waveform in a slightly defocused state is used. In this case, asymmetry of a waveform obtained when a step mark image is defocused a predetermined amount is evaluated to allow an increase in sensitivity to coma.

Such asymmetry is known to change depending on a mark step as well. FIGS. 6A and 6B are graphs showing the values of signal asymmetry generated by the coma of the optical system as a function of step amounts. The graphs exhibit the measurement results in which a step height d of the Si mark having a rectangular step structure is changed and evaluation values E are measured while the coma is present in the optical system. The height d obtained by using the wavelength λ of the exposure light as a modulus is plotted along the abscissa of each of FIGS. 6A and 6B, and an interval between adjacent scale marks is λ/16. The evaluation value E is plotted along the ordinate of each of FIGS. 6A and 6B. The evaluation value E is confirmed to change in the form of a periodic function according to the experiment and simulation, as shown in FIGS. 6A and 6B. It should be noted according to the present invention that the absolute value of the evaluation value E becomes maximum at an odd number multiple (λ/8, 3λ/8, 5λ/8, . . . ) of the step λ/8.

The evaluation value E changes depending on the coma and mark step. That is, it is possible to quantitatively evaluate the coma of the projection optical system by using the evaluation value E. Since the sensitivity of the mark step to the coma becomes maximum at an odd number multiple of λ/8, the coma can be more accurately evaluated and measured when the mark step is set at or near the odd number multiple of ⅛ the exposure wavelength. For this reason, a mark having a step at an odd number multiple of λ/8 is formed in the stage reference mark of the exposure apparatus, and the step mark image is formed with exposure light on the image sensing element through the projection optical system. By evaluating symmetry of the resultant image, the coma of the projection optical system can be accurately and easily measured and evaluated.

The second optical system may be arranged (particularly in an optical path between the projection optical system and image sensing element) in addition to the projection optical system. The step mark on the wafer stage may be imaged on the image sensing element through the projection optical system and second optical system. In this case, an alignment optical system for detecting and measuring alignment marks on a semiconductor substrate or master and performing alignment can also be used as the second optical system or its part.

The imaging performance as a combination of the projection optical system and second optical system can be calculated from image data obtained by image-sensing the step mark on the wafer stage with the projection optical system and second optical system. A step mark like the one described above may be arranged between the projection optical system and second optical system (the master side, e.g., on the master or the reference plate of a master stage on which the master is placed). This mark can be imaged on the image sensing element at the exposure wavelength through the second optical system. This makes it possible to calculate and evaluate the imaging performance, coma, of only the second optical system. In addition, it is also possible to adjust the imaging performance of the second optical system on the basis of the image data of the step mark on the master side. It is, therefore, possible to calculate the imaging performance of the projection optical system while correcting the imaging performance of the second optical system.

Step patterns in a plurality of directions may be used for the step mark disposed on the movable stage and/or the step mark disposed on the master side, in accordance with the direction of image performance to be measured, coma. For example, a recess having an edge direction different from the recess formed by symmetrical steps may be formed as another step pattern.

An optical element or the like (e.g., a projection lens) in the projection optical system may be moved to adjust the imaging performance of the projection optical system on the basis of the calculated imaging performance of the projection optical system. In particular, imaging performance measurement and adjustment can be done with a change in NA of the projection optical system or illumination conditions (e.g., normal illumination, annular illumination, or deformed illumination) of the exposure light. The influence of the change in imaging performance of the projection optical system upon the changes in exposure conditions can be suppressed. In addition, imaging performance measurement and adjustment of the projection optical system can be done at a predetermined interval in accordance with an exposure amount and illumination conditions in continuously projecting and exposing a pattern on a master onto a substrate. The influence of the change in imaging performance of the projection optical system, which is caused by exposure, can be suppressed. This makes it possible to always perform exposure in a good aberration state. In this case, when the aberration calculated as the imaging performance of the projection optical system exceeds a predetermined value, the imaging performance of the projection optical system is adjusted to allow more stable continuous operation.

More specifically, a step mark is formed in the stage reference mark placed on the movable stage (wafer stage), the step mark is imaged through the projection optical system, and coma of the projection optical system can be calculated on the basis of the sensed image data. The aberration of the projection optical system can be adjusted on the basis of the calculated aberration to make it possible to always perform exposure in a good aberration state.

When a display, a network interface, and a computer for executing network software are arranged in an exposure apparatus, data communication for maintenance information of the exposure apparatus is allowed via the computer network. This network software allows obtaining information from a maintenance database via an external network by providing on a display the user interface for accessing the maintenance database provided by the exposure apparatus vendor or user and connected to the external network outside the factory where the exposure apparatus is installed.

Preferred embodiments will now be described with reference to the accompanying drawings.

(First Embodiment)

Figure 1:
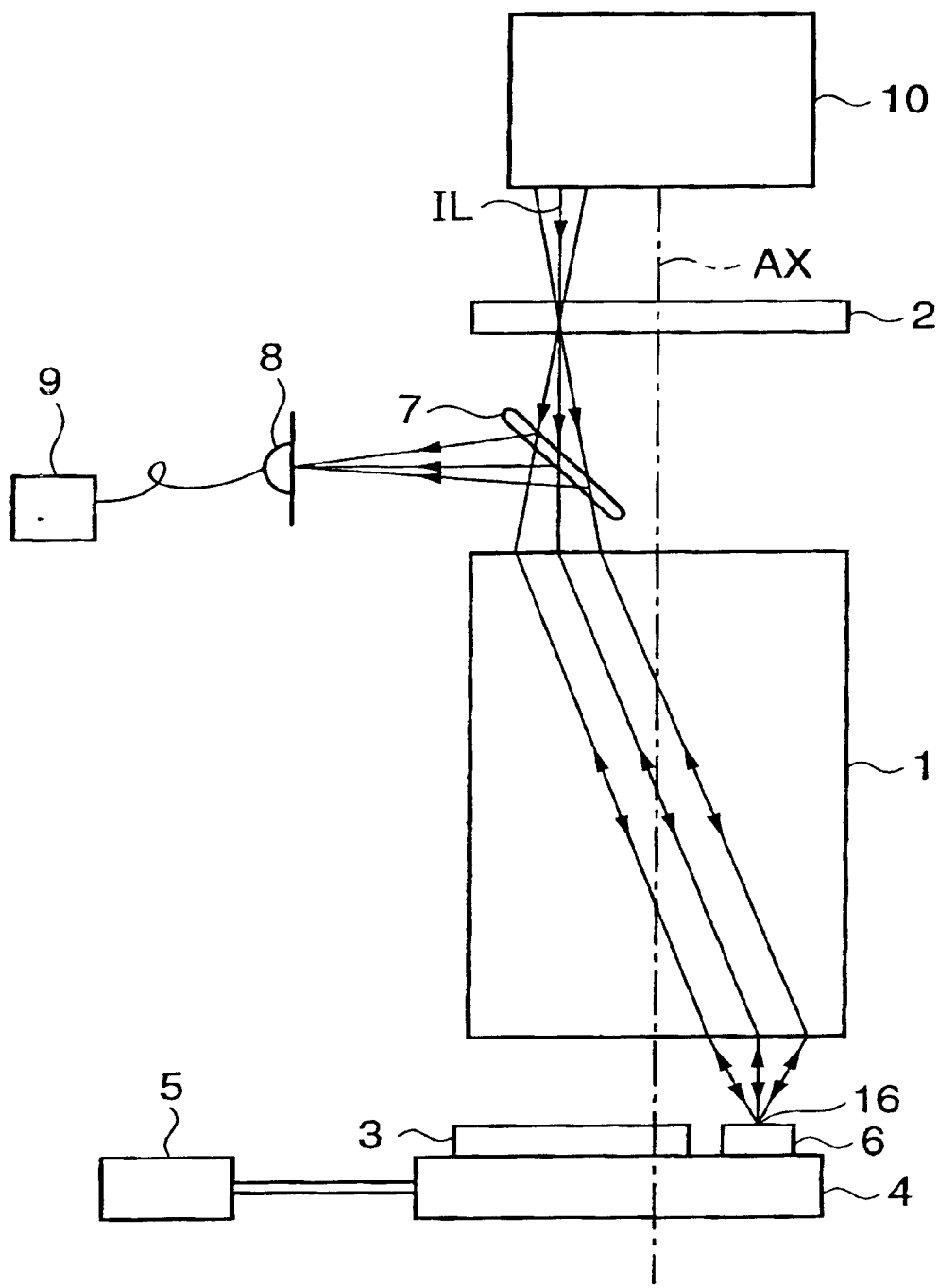
FIG. 1 is a sectional view illustrating a semiconductor exposure apparatus according to the first embodiment of the present invention.

FIG. 1 is a sectional view illustrating a semiconductor exposure apparatus according to the first embodiment.

Referring to FIG. 1, an observation light beam IL emitted from an illumination system 10 passes at a position shifted from an optical axis AX of a reticle 2, half mirror 7, and projection optical system 1 and illuminates a stage reference mark 6 having a step mark 16 (first step mark). This stage reference mark is formed on an X-Y stage 4 which is moved by a stage driving system 5 in a plane perpendicular to the optical axis and mounts a semiconductor wafer 3 to which the pattern of a reticle 2 is exposed. An image of the first step mark 16 is formed on an image sensing element 8 through the projection optical system 1 and half mirror 7. A data processing section 9 calculates the aberration of the projection optical system 1 on the basis of the image data of the first step mark 16 obtained from the image sensing element 8.

The above aberration can be calculated by the calculation method described with reference to FIGS. 5A to 5C and FIGS. 6A and 6B in the first embodiment and the following second to sixth embodiments.

More specifically, when the projection optical system 1 has coma (asymmetrical aberration), and the mark 16 having the step structure shown in FIG. 5A is imaged on the image sensing element 8 by using the projection optical system 1, the waveform of the image of the first step mark 16 becomes asymmetrical, as shown in FIG. 5B, because scattered light beams 42a and 42b are made asymmetrical by coma at the step portion. The calculation for asymmetry can be done by numerically calculating an evaluation value E on the basis of equations (1) to (3) described previously.

As described with reference to FIGS. 6A and 6B, it is confirmed by the experiment and theoretical simulation that the evaluation value E changes depending on the magnitude of coma of the projection optical system 1, and the absolute value of the evaluation value increases with an increase in coma. The coma of the projection optical system can be quantitatively evaluated using this evaluation value.

It is also found that such asymmetry changes depending on the step of the step mark. It is possible to quantitatively evaluate the coma of the projection optical system 1 using the evaluation value E. In addition, since the sensitivity of the step of the step mark is maximized at the odd number multiple of $\lambda/8$, the mark step at or near the odd number multiple of ⅛ the exposure wavelength makes it possible to more accurately measure and evaluate the coma of the projection optical system 1. In this embodiment as well, the measurement accuracy of coma is improved when the step of the step mark 16 of the stage reference mark 6 is set near the odd number multiple of ⅛ the exposure wavelength.

(Second Embodiment)

Figure 2:
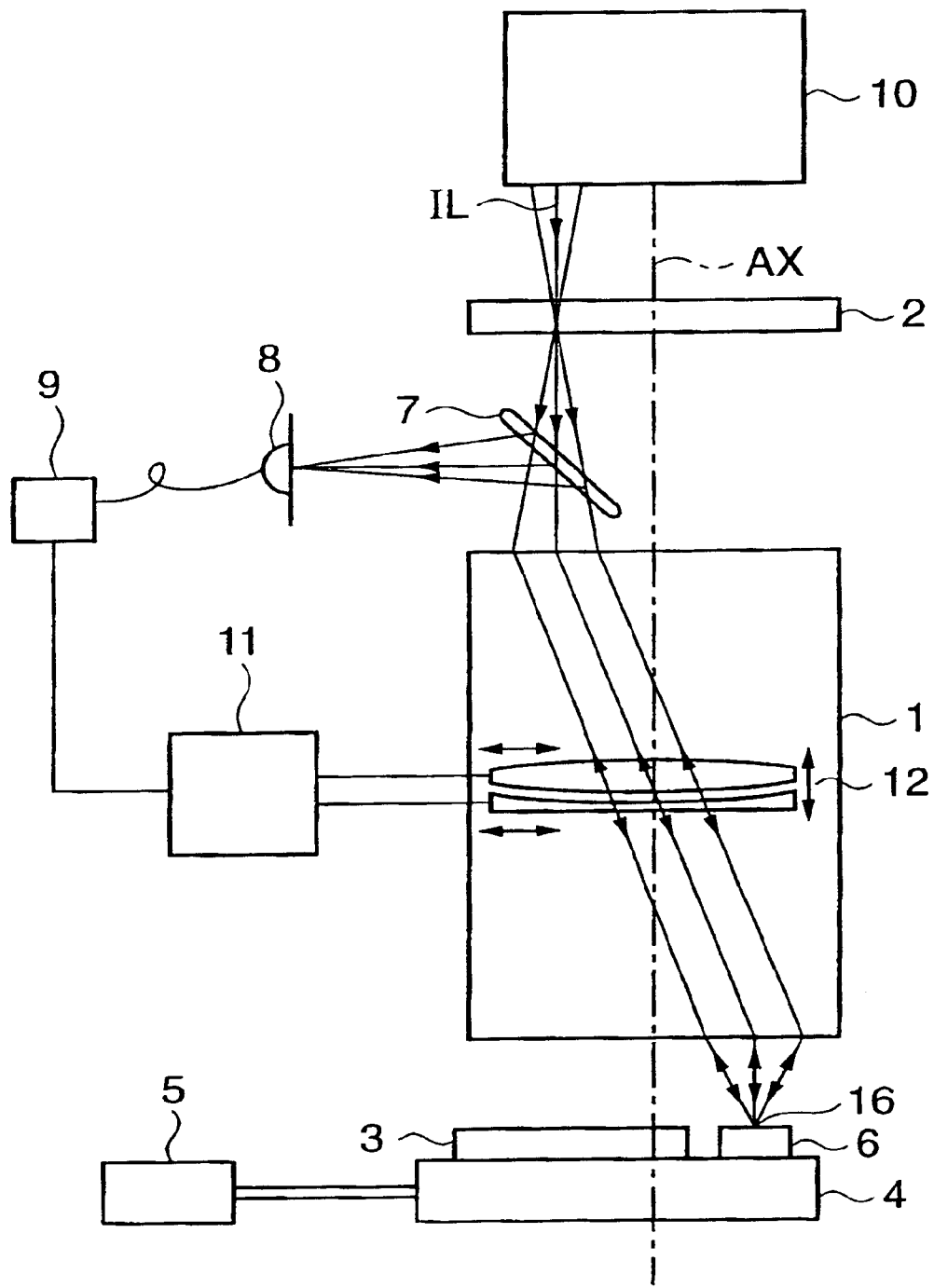
FIG. 2 is a sectional view illustrating a semiconductor exposure apparatus according to the second embodiment of the present invention.

The second embodiment of the present invention will be described with reference to FIG. 2.

A semiconductor exposure apparatus according to the second embodiment is the same as that of the first embodiment except that an aberration correction optical system 11 for adjusting an aberration correction optical system 12 on the basis of information from the aberration correction optical system 12 and a data processing section 9 is arranged. In the apparatus shown in FIG. 2 as well, the aberration of a projection optical system 1 can easily be measured on the main body of the semiconductor exposure apparatus, as in the first embodiment. In the second embodiment, on the basis of the calculated coma of the projection optical system, the aberration correction optical system 12 arranged in the projection optical system 1 shown in FIG. 2 is driven to correct the aberration, or adjust or reduce the aberration of the projection optical system 1 by adjusting an air gap or the like between lenses in the projection optical system 1. Even if the NA of the projection optical system 1 or the illumination conditions of the exposure light are changed, and the aberration of the projection optical system 1 changes over time during continuous exposure, the aberration can be appropriately adjusted as needed. Therefore, exposure can be done while the aberration of the projection optical system 1 is minimized.

(Third Embodiment)

Figure 3:
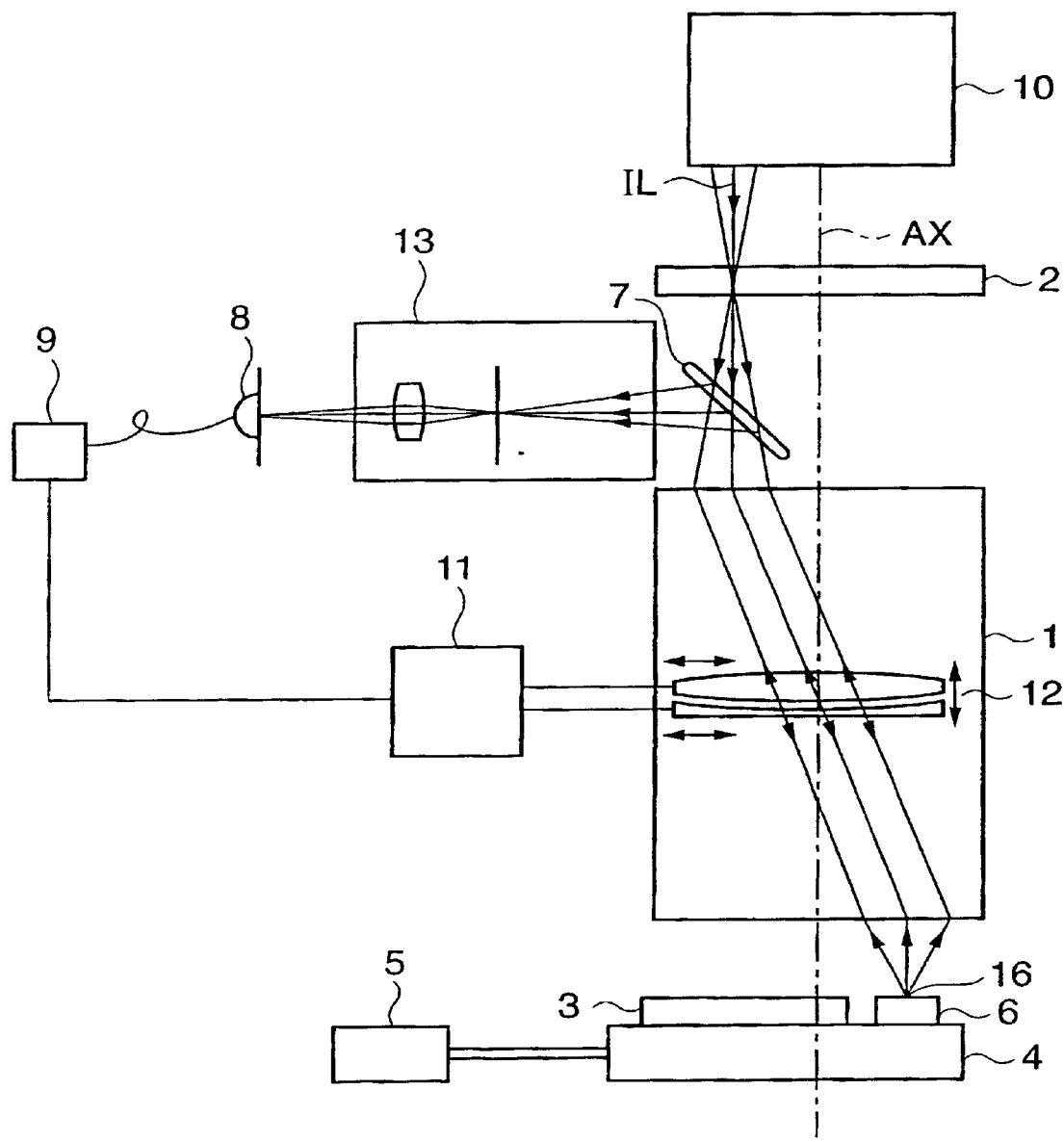
FIG. 3 is a sectional view illustrating a semiconductor exposure apparatus according to the third embodiment of the present invention.

The third embodiment of the present invention will be described with reference to FIG. 3.

A semiconductor exposure apparatus according to the third embodiment is the same as that of the second embodiment except that a step mark 16 on a stage reference mark 6 is imaged on an image sensing element 8 through not only a projection optical system 1 but also a second optical system 13 to obtain image data of the step mark 16. Since the image of the step mark 16 can be enlarged and formed on the image sensing element 8 by using the second optical system 13, the asymmetry of the image of the step mark 16 can be measured with higher accuracy. The measurement precision of the coma of the projection optical system 1 can be improved.

The second optical system 13 can be moved to change the distance between an optical axis AX and the center of the observation field of view. This makes it possible to measure coma for each image height. In this case, the projection optical system 1 has a telecentric change from which an angle of a principal ray on the reticle 2 side slightly changes depending on an image height. For this reason, the optical axis of the second optical system 13 is preferably adjusted to match the telecentric change of the projection optical system 1 for each image height in order to measure the coma of the projection optical system 1 at a plurality of image heights. This is because coma caused by decentering is generated when the angle of the principal ray of the projection optical system 1 does not match the angle of the principal ray of the second optical system 13. As an adjustment method, the angle of an optical element in the second optical system 13 may be changed, or the angle of a half mirror 7 may be changed to match the image height. Alternatively, a method is available in which an adjustment optical system such as a plane-parallel plate (not shown) is arranged in the second optical system 13 to change the angle of the adjustment optical system.

The telecentric angle of the projection optical system 1 may be measured in advance, and the second optical system 13 may be adjusted to this angle. Alternatively, the X-Y position of the step mark 16 on the stage reference mark 6 may be measured while moving the step mark 16 along the optical axis (Z direction) of the projection optical system 1. In this case, the second optical system is adjusted such that the change in measurement value becomes zero, and the telecentric angle on the wafer stage 4 side converges to zero, and the principal ray of the second optical system 13 is matched with the telecentric angle of the projection optical system on the reticle 2 side.

(Fourth Embodiment)

Figure 4:
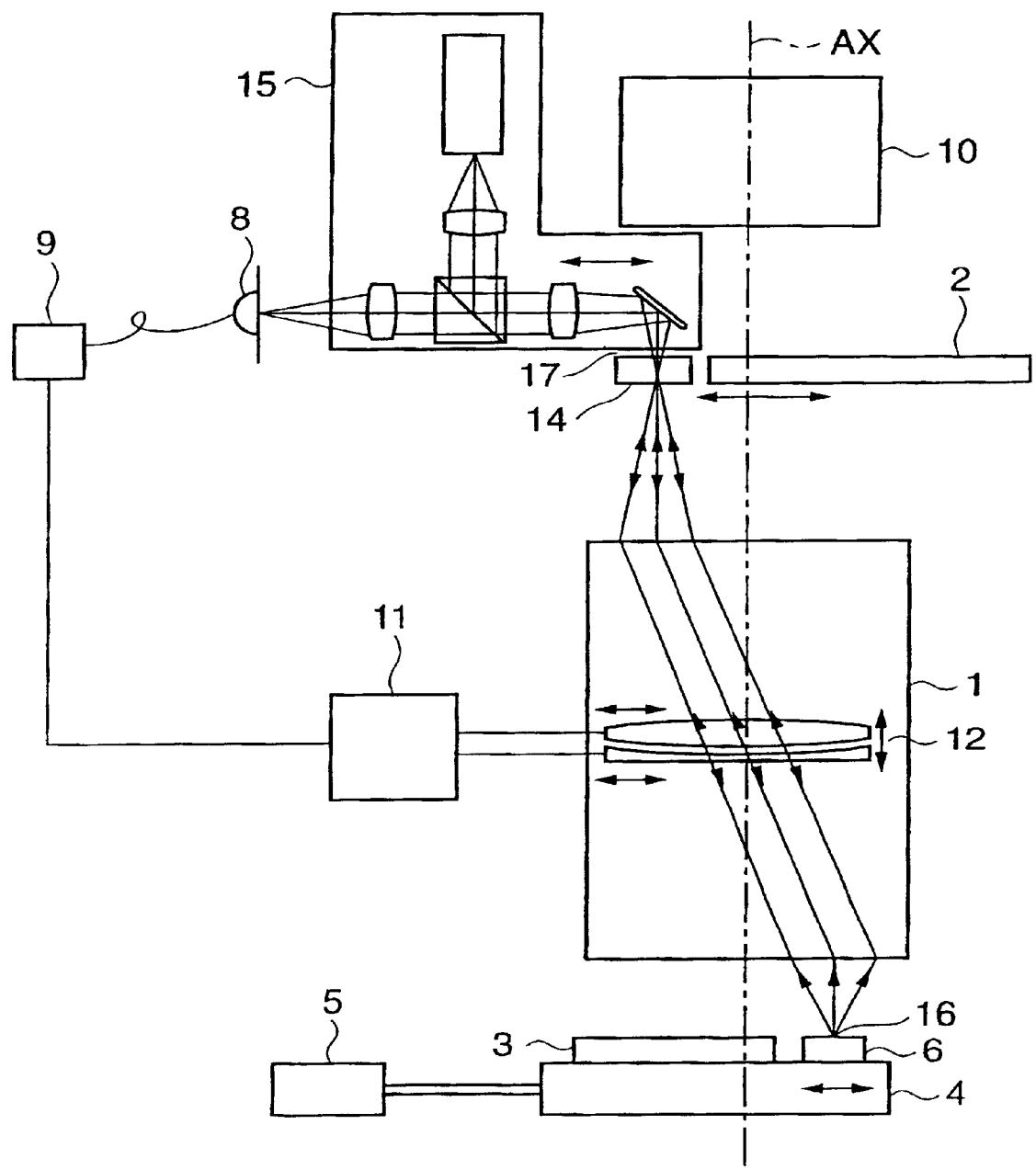
FIG. 4 is a sectional view illustrating a semiconductor exposure apparatus according to the fourth embodiment of the present invention.

The third embodiment has described a method of improving measurement precision of coma using the second optical system. According to the fourth embodiment, as shown in FIG. 4, an alignment optical system 15 capable of observing a reticle and wafer 3 using exposure wavelength light is used as a second optical system. The use of the alignment optical system 15 allows accurate measurement of coma of a projection optical system 1 without arranging a new optical system in the limited space of the exposure apparatus.

In the fourth embodiment, the projection optical system 1 and alignment optical system 15 are used to measure an image of a step mark (to be referred to as a first step mark hereinafter) 16 on a stage reference mark 6. According to this method, asymmetry of the image of the first step mark 16 changes depending on the comas of both the projection optical system 1 and alignment optical system 15. The NA of the alignment optical system 15 is lower by the magnification of the projection optical system 1. A field angle required for the alignment optical system 15 is also small. The alignment optical system 15, therefore, has a small residual aberration. However, the residual aberration may pose a problem when the coma of the projection optical system 1 is to be calculated with a precision exceeding $\lambda/100$. One of the major purposes for measuring aberrations on the main body of the exposure apparatus is to capture a change in aberration of the projection optical system 1 over time. Whether the aberration of the projection optical system 1 has changed over time or the aberration of the alignment optical system 15 has changed cannot be clarified.

According to the characteristic feature of the fourth embodiment, as shown in FIG. 4, a second step mark 17 is formed on a reference plate 14 disposed on the reticle 2 side and imaged on an image sensing element 8 using the alignment optical system 15, and imaging performance, coma of the alignment optical system 15 can be calculated in accordance with the asymmetry of the sensed image. This method is effective for a scanner having a reticle stage to perform scanning and exposure in synchronism with the reticle 2 and wafer 3. The reference plate 14 having the second step mark 17 is always disposed in part of the reticle stage moved with a large stroke for scanning and exposure. The reference plate 14 is moved to an observation image height to always measure the coma of the alignment optical system 15. In addition, the reference plate 14 is not moved in a direction perpendicular to the scanning direction, but a plurality of step marks are prepared. This makes it possible to measure the coma of the alignment optical system 15 alone at a plurality of image heights.

It is also possible to use not the reference plate 14 but a reticle with a step mark. In particular, in a cell projection stepper, a method of forming a step mark on a reticle is facilitated. Step marks are disposed in the reticle at a plurality of image heights. By moving the alignment optical system to each mark position, coma measurement of the alignment optical system is allowed at the plurality of image heights.

According to this embodiment, the coma of each of the projection optical system 1 and alignment optical system 15 can be calculated from the first step mark 16 on an X-Y stage 4. The coma of the alignment optical system 15 can be calculated from the second step mark 17 on the reticle 2 side. The coma of the projection optical system 1 can be calculated from these two coma calculation results. After the coma of the alignment optical system 15 is adjusted and converged using asymmetry of the image of the second step mark 17 as an index, the coma of the projection optical system 1 can be calculated from the image of the first step mark 16. Even if the aberration changes over time, a change in projection optical system 1 or a change in alignment optical system 15 can easily be judged.

As described in the third embodiment, even in the fourth embodiment as well, the optical axis of the alignment optical system 15 is preferably matched with the telecentric angle of the projection optical system for each image height. Even if the angle of the optical axis of the alignment optical system 15 changes over time, the second mark 17 allows the user to easily judge whether the change is on the alignment system 15 or the projection optical system 1.

(Fifth Embodiment)

The imaging performance of a projection optical system is known to change over time due to absorption of exposure light or the like. Absorption of exposure light is also known for an exposure apparatus using an i-line filter. In particular, in an exposure apparatus using as exposure light an ArF excimer laser or light having a shorter wavelength than it, usable glass materials have light absorption, and the optical performance of the projection optical system is known to change due to this absorption. In recent years, scanning exposure apparatuses called scanners have been developed actively. In a scanning exposure apparatus, an illumination region has a slit-like shape, and symmetry of rotation cannot be maintained. An asymmetrical thermal profile is generated with respect to the optical axis of the projection optical system due to light absorption of the glass materials. The imaging performance degrades, i.e., aberrations may be generated. According to the characteristic feature of this embodiment, during continuous exposure, the coma of the projection optical system is measured in a predetermined interval (e.g., once for every five wafers) by using the method described with reference to the first to fourth embodiments. When the measured coma exceeds the predetermined allowable value, the aberration of the projection optical system is adjusted using the method described with reference to the second embodiment. As a result, exposure can be done without degrading the imaging performance, coma, of the projection optical system, which is caused by absorption of the exposure light and the like. Good semiconductor devices can be manufactured. In addition to the measurement and adjustment upon a change in aberration caused by absorption of the exposure light, the aberrations which change due to various environmental factors such as air pressure and ambient temperature can be measured and adjusted.

(Sixth Embodiment)

Even if exposure conditions such as the NA of a projection optical system, the NA of an illumination optical system, and illumination conditions (e.g., normal illumination, annular illumination, and deformed illumination) are changed in accordance with the aberrations left in the projection optical system, the imaging performance of the projection optical system changes. When the exposure conditions are changed, the coma is measured and adjusted by the method described with reference to the first to fourth embodiments. This makes it possible to perform exposure with an optimal aberration for the respective exposure conditions. The change in imaging performance of the projection optical system, which is caused by the absorption of the exposure light, as described with reference to the fifth embodiment, also occurs due to the exposure conditions. During continuous exposure, the interval for measuring the coma of the projection optical system is changed, and the change in aberration of the projection optical system, which is caused by exposure corresponding to each exposure condition, is measured and adjusted at an optimal interval.

In this specification, the evaluation value for asymmetry of the waveform is defined as E, but the evaluation value for asymmetry is not limited to E. For example, an evaluation value for asymmetry, which is most sensitive to coma depending on conditions may be preferably used such that asymmetry of a side peak portion is used. Alternatively, a mark by a phase object for giving a phase difference corresponding to the step amount can be used in place of the step mark formed on the stage reference mark or reticle-side reference plate.

(Embodiment of Semiconductor Production System)

A production system for a semiconductor device (semiconductor chip such as an IC or LSI, liquid crystal panel, CCD, thin-film magnetic head, micromachine, or the like) will be exemplified. A trouble remedy or periodic maintenance of a manufacturing apparatus installed in a semiconductor manufacturing factory, or maintenance service such as software distribution is performed by using a computer network outside the manufacturing factory.

Figure 7:
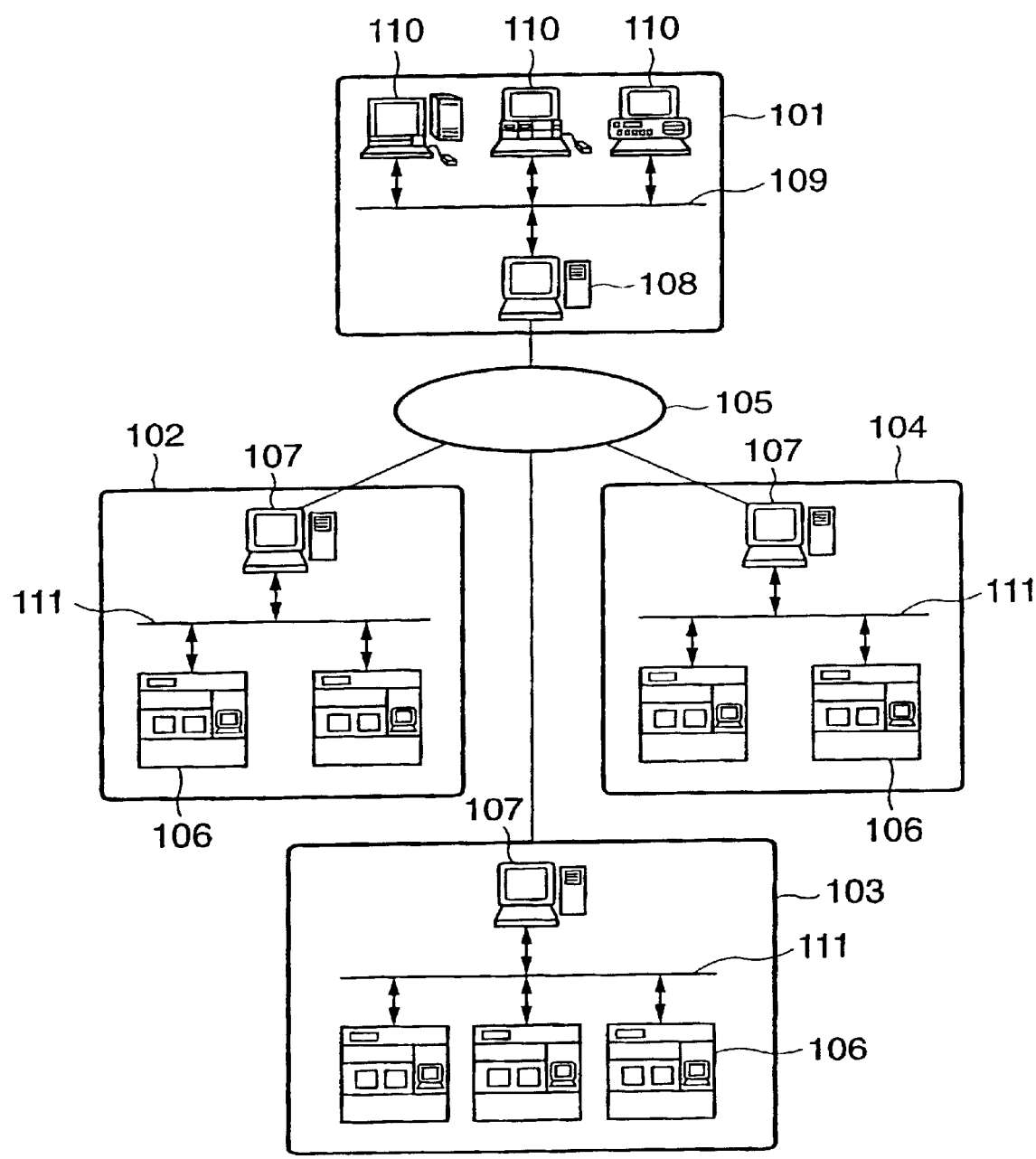
FIG. 7 is a view illustrating a semiconductor device production system when viewed from a given angle.

FIG. 7 shows the overall system cut out at a given angle. In FIG. 7, reference numeral 101 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109 which connects the host management system 108 and computers 110 to construct an intranet. The host management system 108 has a gateway for connecting the LAN 109 to Internet 105 as an external network of the business office, and a security function for limiting external access.

Reference numerals 102 to 104 denote manufacturing factories of the semiconductor manufacturer as users of manufacturing apparatuses. The manufacturing factories 102 to 104 may belong to different manufacturers or the same manufacturer (pre-process factory, post-process factory, and the like). Each of the factories 102 to 104 is equipped with a plurality of manufacturing apparatuses 106, a LAN (Local Area Network) 111 which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user.

More specifically, the factory notifies the vender via the Internet 105 of status information (e.g., the symptom of a manufacturing apparatus in trouble) representing the operation status of each manufacturing apparatus 106. The factory can receive, from the vender, response information (e.g., information designating a remedy against the trouble, or remedy software or data) corresponding to the notification, or maintenance information such as the latest software or help information. Data communication between the factories 102 to 104 and the vender 101 and data communication via the LAN 111 in each factory adopt a communication protocol (TCP/IP) generally used in the Internet. Instead of using the Internet as an external network of the factory, a dedicated-line network (e.g., ISDN) having high security which inhibits access of a third party can be adopted. It is also possible that the user constructs a database in addition to one provided by the vendor and sets the database on an external network and that the host management system authorizes access to the database from a plurality of user factories.

The measured coma information of each exposure apparatus is contained in status information representing the operating status of the manufacturing apparatus 106 in this embodiment. On the basis of coma information from the user side, the vendor-side host management system transmits information of processing to be executed by the user for the apparatus and software and help information required for this processing. Alternatively, the vendor-side host management system determines whether maintenance is necessary and then presents maintenance information to maintenance personnel within the vendor.

Figure 8:
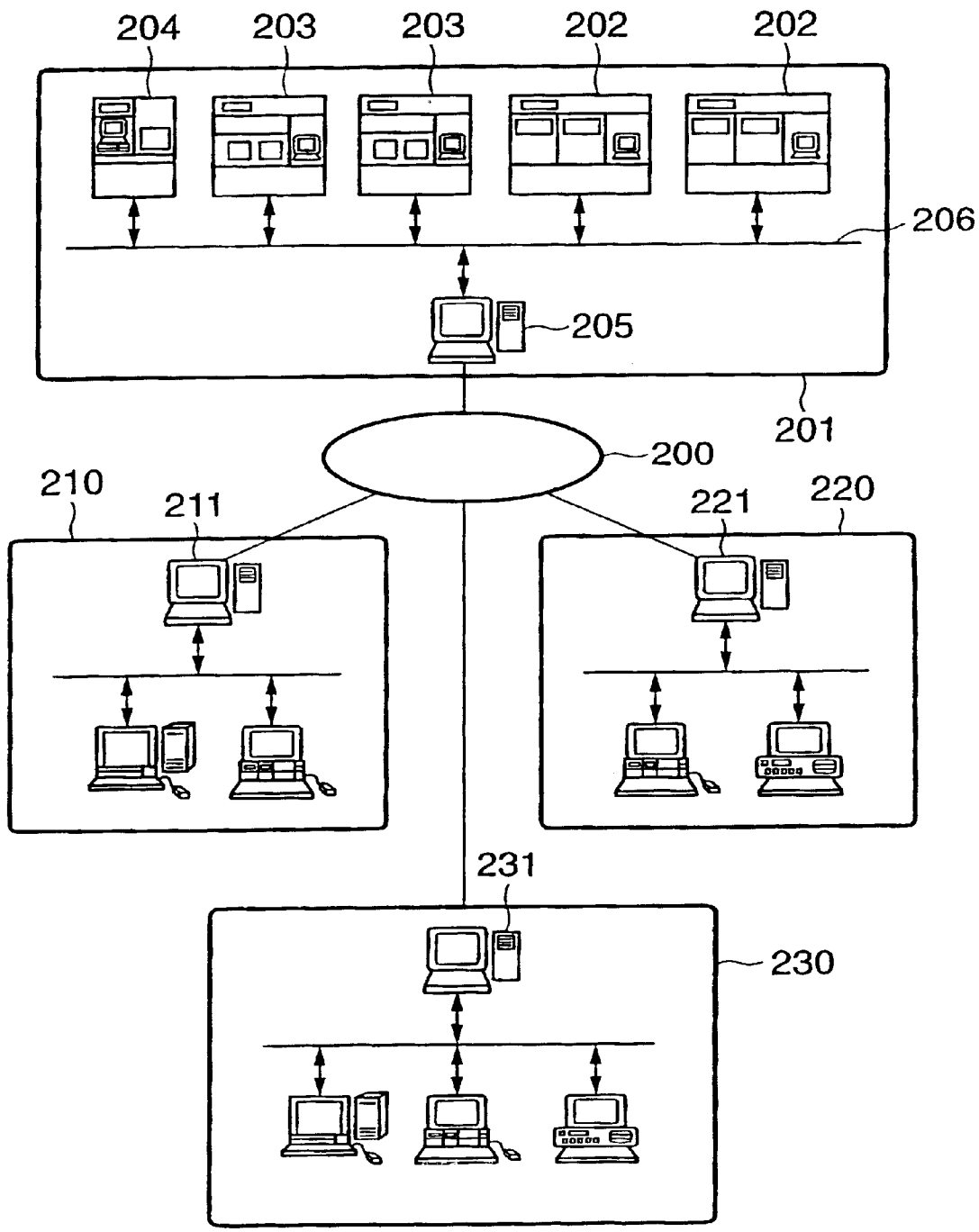
FIG. 8 is a view illustrating the semiconductor device production system when viewed from another angle.

FIG. 8 is a view showing the concept of the overall system of this embodiment that is cut out at a different angle from FIG. 7. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 8, a factory having manufacturing apparatuses of a plurality of vendors, and the management systems of the vendors for these manufacturing apparatuses are connected via the external network of the factory, and maintenance information of each manufacturing apparatus is communicated.

In FIG. 8, reference numeral 201 denotes a manufacturing factory of a manufacturing apparatus user (semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 8 shows only one manufacturing line of the factory. FIG. 8 shows only one manufacturing factory 201, but a plurality of factories are networked in practice. The respective apparatuses in the factory are connected to a LAN 206 to construct an intranet, and a host management system 205 manages the operation of the manufacturing line. The business offices of vendors (apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated-line network serving as an external network 200. If trouble occurs in any one of a series of manufacturing apparatuses along the manufacturing line in this systems, the operation of the manufacturing line stops. This trouble can be quickly solved by remote maintenance from the vendor of the apparatus in trouble via the Internet 200. This can minimize the stop of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 9 on the display. While referring to this window, the operator who manages manufacturing apparatuses in each factory inputs, in input items on the windows, pieces of information such as the type of manufacturing apparatus (401), serial number (402), subject of trouble (403), occurrence date (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 9. This allows the operator to access detailed information of each item, receive the latest-version software to be used for a manufacturing apparatus from a software library provided by a vendor, and receive an operation guide (help information) as a reference for the operator in the factory. As described above, the above-mentioned coma information of the exposure apparatus 202 is contained in status information representing the operating status of the manufacturing apparatus in this embodiment.

Figure 10:
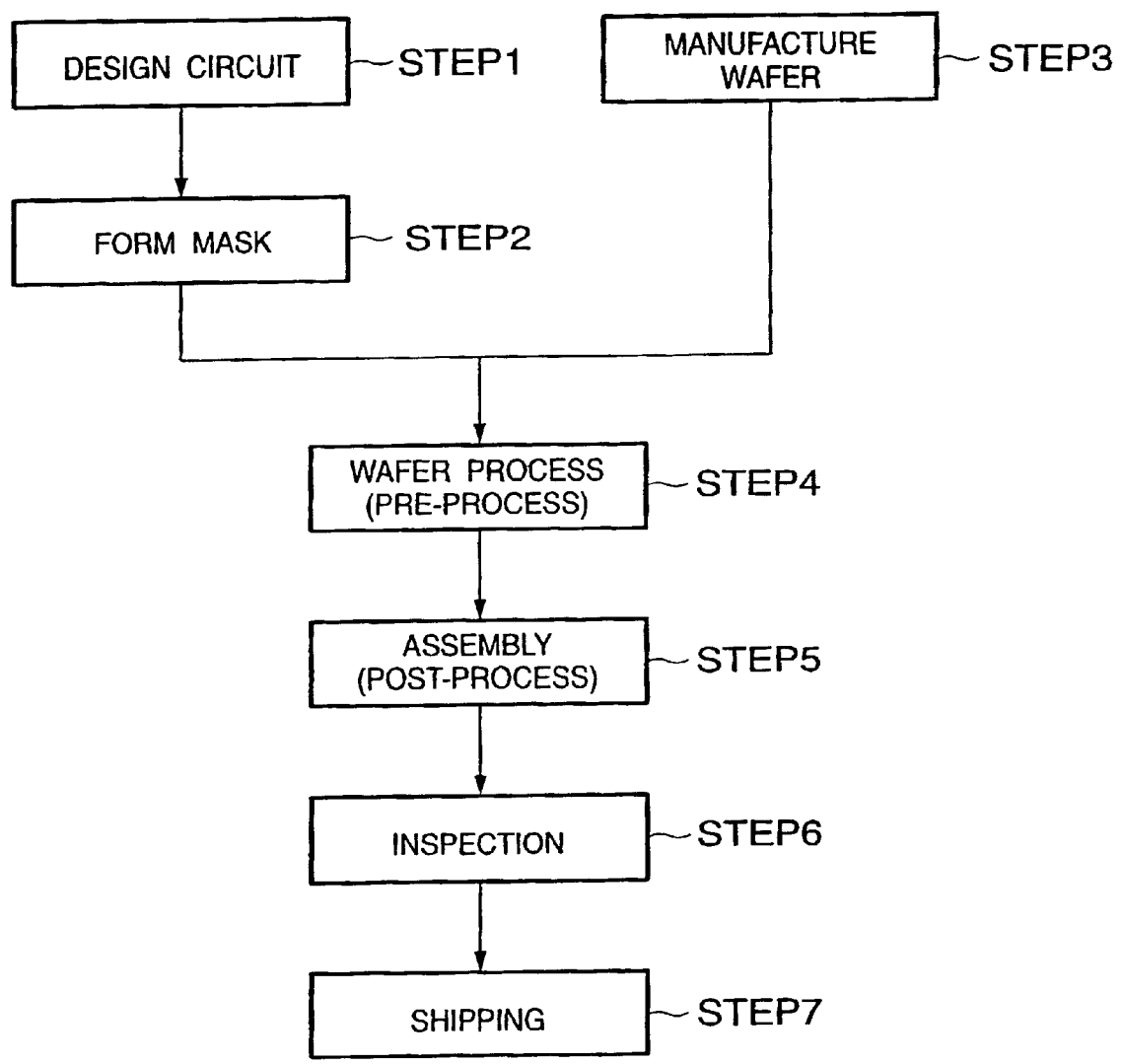
FIG. 10 is a view for explaining the flow of a device manufacturing process.

A semiconductor device manufacturing process using the above-described production system will be explained. FIG. 10 shows the flow of the whole manufacturing process of the semiconductor device. In step 1 (circuit design), a semiconductor device circuit is designed. In step 2 (mask formation), a mask having a designed circuit pattern is formed. In step 3 (wafer manufacture), a wafer is manufactured using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated-line network.

Figure 11:
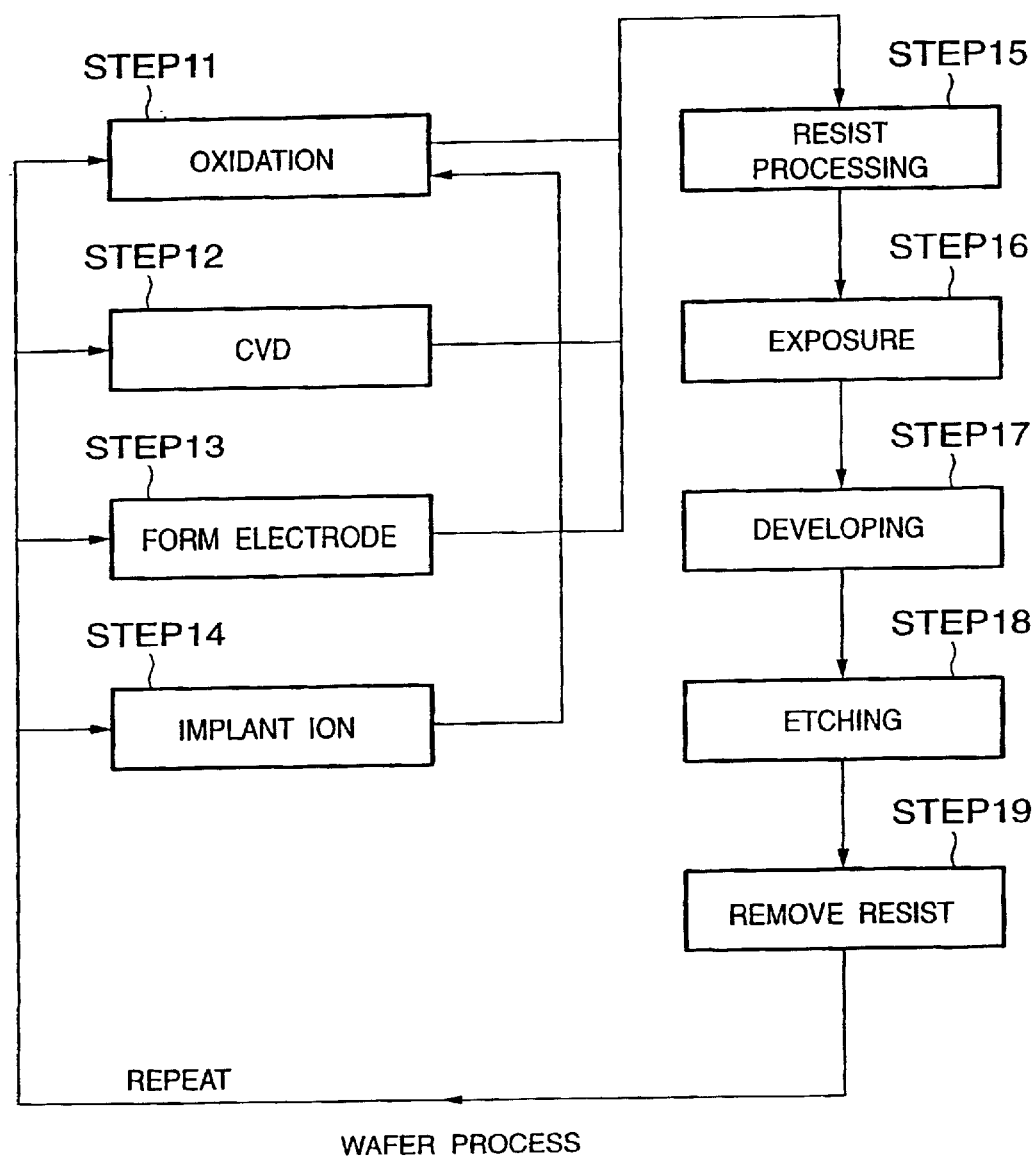
FIG. 11 is a view for explaining a wafer process.

FIG. 11 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus bakes and exposes the circuit pattern of a mask on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

The present invention is not limited to the above embodiments and various changes and modifications can be made within the spirit and scope of the present invention. Therefore, to apprise the public of the scope of the present invention, the following claims are made.

What is claimed is:

1. An exposure apparatus for projecting and exposing through a projection optical system a transfer pattern formed on a master onto a substrate placed on a movable stage, said apparatus comprising:
   a mark placed on the movable stage and imparting a phase difference to incident light, based on an incident position, and then outputting the light;
   an image reception section, wherein said mark is imaged on said image reception section, using light of an exposure wavelength through the projection optical system; and
   a data processing section for calculating an imaging performance of the projection optical system on the basis of image data obtained by said image reception section.

2. The apparatus according to claim 1, wherein the transfer pattern is exposed to a semiconductor wafer using a reticle or photomask as the master.

3. The apparatus according to claim 1, wherein said data processing section calculates the imaging performance of the projection optical system on the basis of symmetry of said step mark in the image data.

4. The apparatus according to claim 1, wherein the imaging performance of the projection optical system comprises coma.

5. The apparatus according to claim 1, wherein said mark is a step mark for which the step is set at or near an odd number multiple of ⅛ an exposure wavelength.

6. The apparatus according to claim 1, further comprising a second optical system disposed between said image reception section and said projection optical system.

7. The apparatus according to claim 6, wherein said second optical system includes at least part of an alignment optical system for detecting an alignment mark on the master or substrate.

8. The apparatus according to claim 7, wherein said second optical system comprises the alignment optical system.

9. The apparatus according to claim 6, wherein a second mark imparting a phase difference to incident light, based on an incident position, is disposed between the projection optical system and said second optical system.

10. The apparatus according to claim 9, wherein the second mark is formed on the master or a master stage on which the master is placed.

11. The apparatus according to claim 9, wherein said data processing section calculates an imaging performance of said second optical system on the basis of image data obtained when the second mark is imaged on the image sensing element at the exposure wavelength through said second optical system.

12. The apparatus according to claim 11, wherein said data processing section calculates the imaging performance of the projection optical system while correcting the imaging performance of said second optical system.

13. The apparatus according to claim 9, wherein at least one of said mark placed on the movable stage and the second mark has at least two step patterns having different directions.

14. The apparatus according to claim 1, further comprising an optical system driving mechanism for adjusting a state of the projection optical system on the basis of the imaging performance of the projection optical system.

15. The apparatus according to claim 1, wherein said data processing section calculates the imaging performance of the projection optical system when a numerical aperture of the projection optical system or an illumination condition of exposure light is changed.

16. The apparatus according to claim 1, wherein when the pattern on the master is to be continuously projected and exposed to the substrate, said data processing section calculates the imaging performance of the projection optical system at a predetermined interval corresponding to an exposure condition including an exposure amount and the illumination condition.

17. The apparatus according to claim 14, wherein when aberration calculated as the imaging performance of the projection optical system is larger than a preset value, said optical system driving mechanism adjusts the imaging performance of the projection optical system.

18. A method of measuring imaging performance of a projection optical system, said method comprising the steps of:
   locating a mark planed near an image surface of the projection optical system, the mark imparting a phase difference to incident light, based on an incident position, and then outputting the light;
   sensing an image of the mark by an image sensing element through the projection optical system by using light with a wavelength used in the projection optical system; and
   calculating the imaging performance of the projection optical system from the sensed image data.

19. The method according to claim 18, wherein in the step of calculating the imaging performance of the projection optical system, the mark is a step mark for which the step is set in an odd number multiple of $1/8$ an exposure wavelength of the projection optical system to measure coma.

20. A device manufacturing method comprising the steps of:
   installing in semiconductor manufacturing factory manufacturing apparatuses, for performing various processes, including an exposure apparatus for projecting and exposing through a projection optical system a transfer pattern formed on a master onto a substrate placed on a movable stage, the exposure apparatus comprising a mark imparting a phase difference to incident light, based on an incident position, and then outputting the light, an image reception section for imaging the mark on an image sensing element at an exposure wavelength through the projection optical system, and a data processing section for calculating an imaging performance of the projection optical system on the basis of image data obtained by the image reception section; and
   manufacturing a semiconductor device by performing a plurality of processes using the manufacturing apparatuses.

21. The method according to claim 20, further comprising the steps of:
   connecting the manufacturing apparatuses via a local area network; and
   communicating data information about at least one of the manufacturing apparatuses between the local area network and an external network outside the semiconductor manufacturing factory.

22. The method according to claim 20, further comprising performing one of (i) accessing a database provided by a vendor or user of the exposure apparatus via the external network to obtain maintenance information of the manufacturing apparatus by data communication, and (ii) performing data communication between the semiconductor manufacturing factory and another semiconductor manufacturing factory via the external network, thereby performing production management.

23. A semiconductor manufacturing factory comprising:
   manufacturing apparatuses, for performing various processes, including an exposure apparatus for projecting and exposing through a projection optical system a transfer pattern formed on a master onto a substrate placed on a movable stage, the exposure apparatus comprising a mark imparting a phase difference to incident light, based on an incident position, and then outputting the light, an image reception section for imaging the mark on an image sensing element at an exposure wavelength through the projection optical system, and a data processing section for calculating an imaging performance of the projection optical system on the basis of image data obtained by the image reception section;
   a local area network for connecting the manufacturing apparatuses; and
   a gateway for allowing access to an external network outside the factory from the local area network,
   wherein data information about at least one of the manufacturing apparatuses is communicated.

24. A maintenance method for an exposure apparatus installed in a semiconductor manufacturing factory to project and expose through a projection optical system a transfer pattern formed on a master onto a substrate placed on a movable stage, the exposure apparatus comprising a mark imparting a phase difference to incident light, based on an incident position, and then outputting the light, an image reception section for imaging the mark on an image sensing element at an exposure wavelength through the projection optical system, and a data processing section for calculating an imaging performance of the projection optical system on the basis of image data obtained by the image reception section, said method comprising the steps of:
   making a vendor or user of the exposure apparatus provide a maintenance database connected to an external network outside the semiconductor manufacturing factory;

allowing access to the maintenance database from the semiconductor manufacturing factory via the external network; and transmitting maintenance information accumulated in the maintenance database to the semiconductor manufacturing factory via the external network.

25. An exposure apparatus for projecting and exposing through a projection optical system a transfer pattern formed on a master onto a substrate placed on a movable stage, the exposure apparatus including a mark imparting a phase difference to incident light, based on an incident position, and then outputting the light, an image reception section for imaging said mark on an image sensing element at an exposure wavelength through the projection optical system, and a data processing section for calculating an imaging performance of the projection optical system on the basis of image data obtained by said image reception section, said apparatus comprising:

a display;

a network interface; and a computer for executing network software, wherein maintenance information of the exposure apparatus is communicated via a computer network.

26. The apparatus according to claim 25, wherein said network software provides on said display said user interface for accessing a maintenance database provided by a vendor or user of the exposure apparatus and connected to the external network outside a factory in which the exposure apparatus is installed, and information is obtained from the database through the external network.

* * * * *

UNITED STATES PATENT AND TRADEMARK OFFICE
CERTIFICATE OF CORRECTION

PATENT NO. : 6,646,714 B2
DATED : November 11, 2003
INVENTOR(S) : Yoshinori Ohsaki It is certified that error appears in the above-identified patent and that said Letters Patent is hereby corrected as shown below:

Column 1,
Line 55, "line-end-space" should read -- line-and-space --.

Column 8,
Line 3, "mark step" should read -- step mark --.

Column 13,
Line 14, "systems," should read -- system, --.

Column 15,
Line 45, "planed' should read -- placed --.

Signed and Sealed this

Twentieth Day of April, 2004

JON W. DUDAS
*Acting Director of the United States Patent and Trademark Office*